US010733330B2

(12) United States Patent
Dubart et al.

(10) Patent No.: US 10,733,330 B2
(45) Date of Patent: Aug. 4, 2020

(54) 3D TOPOGRAPHIC AND RADIOLOGICAL MODELING OF AN ENVIRONMENT

(71) Applicant: STMI Societe des Techniques en Milieu Ionisant, Gif sur Yvette (FR)

(72) Inventors: Philippe Dubart, Chatenay Malabry (FR); Massimo Morichi, Paris (FR)

(73) Assignee: ORANO DS—DÉMANTÈLEMENT ET SERVICES, Gif sur Yvette (FR)

( * ) Notice: Subject to any disclaimer, the term of this patent is extended or adjusted under 35 U.S.C. 154(b) by 844 days.

(21) Appl. No.: 14/912,480

(22) PCT Filed: Jul. 2, 2014

(86) PCT No.: PCT/EP2014/064038
§ 371 (c)(1),
(2) Date: Feb. 17, 2016

(87) PCT Pub. No.: WO2015/024694
PCT Pub. Date: Feb. 26, 2015

(65) Prior Publication Data
US 2016/0203240 A1 Jul. 14, 2016

(30) Foreign Application Priority Data

Aug. 23, 2013 (FR) ..................................... 13 58153

(51) Int. Cl.
*G06F 30/00* (2020.01)
*G01T 7/00* (2006.01)
(Continued)

(52) U.S. Cl.
CPC ............... *G06F 30/00* (2020.01); *G01T 7/00* (2013.01); *F15B 21/041* (2013.01); *G01N 15/10* (2013.01)

(58) Field of Classification Search
None
See application file for complete search history.

(56) References Cited

U.S. PATENT DOCUMENTS 6,467,328 B1 * 10/2002 Kalkum ................ B01L 3/0241
73/1.01
6,782,123 B1  8/2004 Guillon
(Continued)

FOREIGN PATENT DOCUMENTS

EP  0 960 344  12/1999
EP  1 170 681 A2  1/2002
(Continued)

OTHER PUBLICATIONS

Ruizhong Lin et al., "Wireless Sensor Networks Solutions for Real Time Monitoring of Nuclear Power Plant" Proceedings of the 5th World Congress on Intelligent Control and Automation, Jun. 15-19, 2004.

(Continued)

*Primary Examiner* — Kibrom K Gebresilassie
(74) *Attorney, Agent, or Firm* — Pearne & Gordon LLP

(57) ABSTRACT

A method for modeling an environment with a risk of nuclear contamination comprising steps of: acquiring, using a detector (10) and through a 3-dimensional displacement of the detector in the environment, information related to the topography of the environment and radiological measurement data of the environment, and then via a computer processing unit (20), associating the radiological measurement data with location data in the environment, the location data having been deduced from path data of the detector, incrementially creating, using the information and via the computer processing unit: at least one matrix in which topographic data of the environment and the radiological data associated with the location data are compiled, and a 3-dimensional mapping representing the environment in which the topographic data and the radiological data are jointly represented.

12 Claims, 5 Drawing Sheets

(51) Int. Cl.
 *F15B 21/041* (2019.01)
 *G01N 15/10* (2006.01)

(56) References Cited

U.S. PATENT DOCUMENTS

| | | | |
|---|---|---|---|
| 6,917,893 B2 | 7/2005 | Dietsch | |
| 7,279,676 B2* | 10/2007 | Twomey | G01T 1/167 250/252.1 |
| 8,242,456 B1* | 8/2012 | Hecht | G01V 5/0075 250/252.1 |
| 8,274,406 B2 | 9/2012 | Karlsson | |
| 8,489,176 B1* | 7/2013 | Ben-David | A61B 6/4258 600/3 |
| 8,502,158 B1* | 8/2013 | Gordeev | G01T 7/00 250/394 |
| 9,035,260 B2* | 5/2015 | Kim | G01T 1/163 250/358.1 |
| 9,091,628 B2* | 7/2015 | Sezen | G01V 5/0016 |
| 9,374,537 B2* | 6/2016 | Takahashi | H04N 5/30 |
| 2001/0033772 A1* | 10/2001 | Gilmore | A01M 17/002 405/128.75 |
| 2005/0118704 A1* | 6/2005 | Malobabic | G01N 1/14 435/287.1 |
| 2006/0221072 A1 | 10/2006 | Se | |
| 2010/0262400 A1 | 10/2010 | DeVito | |
| 2011/0024611 A1* | 2/2011 | Cunningham | H01L 27/14601 250/252.1 |
| 2011/0046478 A1* | 2/2011 | Kornblau | A61B 6/4258 600/424 |
| 2012/0043471 A1* | 2/2012 | Harpring | G01T 7/00 250/394 |
| 2012/0106868 A1 | 5/2012 | Lin | |
| 2012/0262550 A1 | 10/2012 | Bridges | |
| 2013/0022233 A1 | 1/2013 | Ma | |
| 2017/0199979 A1* | 7/2017 | Reiner | G16H 50/30 |
| 2017/0299714 A1* | 10/2017 | Rohani | G01S 7/043 |

FOREIGN PATENT DOCUMENTS

| | | |
|---|---|---|
| EP | 2 203 854 | 7/2010 |
| EP | 2 378 314 A2 | 10/2011 |
| FR | 2 759 791 A1 | 8/1998 |
| JP | 2001153952 A | 6/2001 |
| JP | 2013113610 A | 6/2013 |
| WO | 97/01769 A1 | 1/1997 |
| WO | 98/39628 A2 | 9/1998 |
| WO | 2006/084385 A1 | 8/2006 |
| WO | 2008/037988 A1 | 4/2008 |
| WO | 2009/053385 A1 | 4/2009 |
| WO | 2012/107720 A2 | 8/2012 |
| WO | 2012/131329 A2 | 10/2012 |

OTHER PUBLICATIONS

Search Report issued in French Patent Application No. FR 13 58153 dated Apr. 10, 2014.
International Search Report issued in Application No. PCT/EP2014/064038 dated Aug. 5, 2014.
Written Opinion issued in Application No. PCT/EP2014/064038 dated Aug. 5, 2014.
English Translation of Office Action for Japanese Patent Application No. 2016-535375 dated Mar. 27, 2018.

* cited by examiner

3D TOPOGRAPHIC AND RADIOLOGICAL MODELING OF AN ENVIRONMENT

TECHNICAL FIELD AND PRIOR ART

The present invention relates to a method and a device for modeling an environment containing radioactive material, and likely to have a risk of radiological contamination.

The radiological or radioactive contamination is the undesirable presence, at a significant level, of radioactive substances at the surface or inside structures present on sites such as an electricity production nuclear power plant, a nuclear material or nuclear waste processing facility, a research laboratory.

For example, when an accident occurs on a nuclear site, a crisis team dedicated to the accident management can create a hypothesis set to foresee the consequences of this accident before intervening on the site and conducting a possible decontamination.

EP 2 203 854 A0 provides a method for managing an accident with a time evolution, which occurs inside a high risk facility and wherein preset geometric data of a source of noxious substances that are associated with a computation of amount of noxious substances are used to implement a diagnosis prior to an intervention.

Such a method requires a prior knowledge of the environment topography, and implementing heavy computations especially in terms of processing time.

Certain sites can have a modular arrangement intended to change overtime, consequently one can not always rely on preset topography data of a site upon intervening on this site.

In some cases, for example when the accident occurs as a result of a natural disaster and causes a significant modification of the topography of a site, a prior knowledge of a mapping of the site can also prove to be insufficient.

In the same time, one tries to be able to locate oneself in a site where one wants to intervene, for example in order to conduct measurements of nuclear contamination.

There arises the problem of finding a new method for modeling an environment with a risk of nuclear contamination, which is improved with respect to the abovementionned problems.

DISCLOSURE OF THE INVENTION

An aspect of the invention provides a method for modeling an environment with a risk of nuclear contamination comprising steps of:

a) acquiring, using detection means and through a 3-dimensional displacement of these detection means in said environment, information related to the topography of said environment and radiological measurement data of said environment, and then via computer processing means, b) associating said radiological measurement data with location data in said environment, said location data having been deduced from path data of said detection means, c) incrementally creating, using said information and via said computer processing means: at least one matrix in which topographic data of said environment and said radiological data associated with the location data are compiled, and a 3-dimensional mapping representing said environment in which said topographic data and said radiological data are jointly represented.

The detection means can be integrated into a terminal provided with a screen. The 3D mapping can be developed in real time and be displayed on the terminal screen as it is developed.

According to a possible implementation, the computer processing means can also be integrated into the terminal.

Alternatively, the computer processing means are suitable for a remote communication with the detection means integrated into the terminal.

Using a 3D mapping such as implemented according to the invention, displacements of the intervening operators in an environment submitted to ionizing radiations can be scheduled.

An environment modeling in which topographic information are associated with radiological informations makes it possible to identify areas in which displacements of an operator are not recommended or forbidden and to distinguish these areas from other regions of the site in which the operator intervening on the site can perform, in order to respect standards related to the maximum doses of ionizing radiation to which the intervening operators can be submitted.

The modeling method can further comprise steps of:
identifying one or more source(s) of radioactive substance(s) in said environment,
locating said sources of radioactive substance(s) on said mapping created in step c).

A 3D mapping implemented according to the invention can also inform an intervening operator on a contaminated site of the accurate location of the ionizing radiation sources. It can for example enable a scenario for dismantling a site to be created.

The modeling method can further comprise a step of estimating an activity level of one or more identified sources of radioactive substance(s).

The radionuclide composition of said sources of radioactive substance(s) can also be determined.

The modeling method can also further comprise a step of determining geometrical characteristics of the identified sources of radioactive substance(s).

The modeling method can also further comprise a step of determining characteristics related to the medium or to the material in which said identified sources of radioactive substance(s) are.

The method can further comprise a step of creating another 3D mapping in which the identified sources of radioactive substance(s) and their estimated activity are jointly represented. A new computation at any point of the space of the emergent flux (dose rate, energy fluency) can also be implemented.

According to a possible implementation of the modeling method, acquiring information related to the topography of said environment can comprise acquiring, by said detection means, one or more image(s) of said environment.

The path data can then be estimated at least from said image(s) of said environment.

As an alternative or combination, the path data can be estimated at least from position and/or displacement measurements of the detection means, and at least from distance measurements between the detection means and one or more element(s) of said environment.

The modeling method can also comprise a step of creating a depth map from distance measurements between the detection means and one or more element(s) of said environment.

Another aspect of the present invention also provides a computer program comprising program code instructions for enabling at least several of the abovementioned steps, except the acquiring step a), of the modeling method to be executed.

Another aspect of the present invention also provides a computer program product comprising instructions of a program code recorded in a medium useable by the computer processing means, comprising readable programming means for implementing at least several of the abovementioned steps, except the acquiring step a), of the modeling method.

Another aspect of the present invention also provides a digital data medium usable by the computer processing means, comprising instructions of a computer program code such as abovedefined.

According to another aspect, the present invention provides a device for modeling an environment with a risk or risks of nuclear contamination comprising:
  detection means provided with means for acquiring topographic data of said environment, and of means for acquiring radiological measurement data of said environment,
  computer processing means, configured to:
  associate said radiological measurement data with location data in said environment, said location data having been deduced from path data of said detection means,
  incrementally create at least one matrix in which topographic data of said environment and said radiological data associated with the location data are combined, and a 3D mapping representing said environment in which said topographic data and said radiological data are jointly represented, The detection means can be integrated into a terminal. The 3D mapping can be created in real time and can be displayed on a screen as it is created, and in particular on a screen of the terminal.

The computer processing means can also be integrated into the terminal.

As an alternative, the computer processing means are configured for a remote communication with the detection means integrated into the terminal.

Advantageously, the computer processing means further comprise means for:
  identifying from said matrix, one or more set(s) of data describing at least one source of radioactive substance(s) in said environment,
  locating said source of radioactive substance(s) on said created 3D mapping.

According to a possible implementation, the computer processing means can further comprise means for estimating an activity level of said source of radioactive substance(s).

The computer processing means can be further configured to create another 3D mapping in which the identified source of radioactive substance(s), its estimated activity, are jointly represented. Emergent flux coming from the source and which can be recomputed at any point of the space can also be represented.

The computer processing means can also comprise means for estimating the path of the detection means at least from an image or images of said environment.

The computer processing means can also comprise means for estimating the path of the detection means at least from position and/or displacement measurements of the detection means, and at least from distance measurements between the detection means and one or more element(s) of said environment.

BRIEF DESCRIPTION OF THE DRAWINGS

The present invention will be better understood upon reading the description of exemplary embodiments given by way of purely indicating and in no way limiting example, with reference to the accompanying drawings in which.

Identical, similar or equivalent parts of the different figures bear the same reference numerals so as to facilitate switching from one figure to the other.

The different parts represented in the figures are not necessarily drawn to a uniform scale in order to make the figures more understandable.

DETAILED DISCLOSURE OF PARTICULAR EMBODIMENTS

Figure 1:
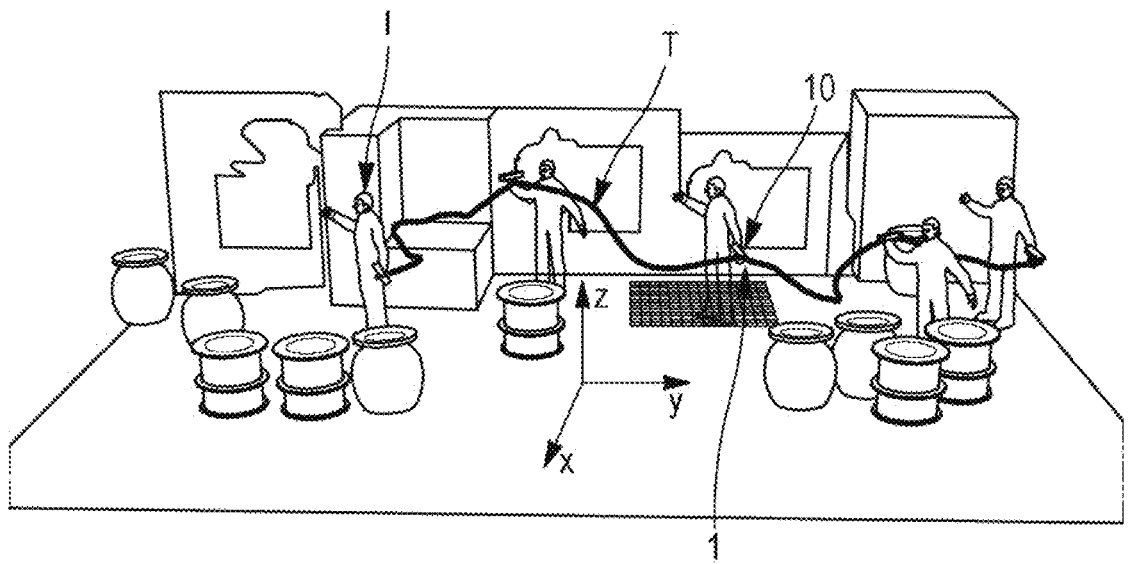
FIG. 1 represents an intervening operator on a contaminated nuclear site, equipped with a detection device for collecting data useful for implementing a 3D mapping in which the topography and the radiological data of the site are jointly represented, FIGS. 2-3 respectively illustrate a simultaneous acquisition, by an intervening operator, of topographic data and radiological data of a contaminated site, FIGS. 4-5 respectively illustrate an implementation of a model of topographic data of the contaminated site and a model of radiological data of the contaminated site acquired along the path followed by the intervening operator.

FIG. 1 illustrates an acquisition of measurements performed by an intervening operator I, displacing in a contaminated site in which there is radioactive material.

The intervening operator I uses a detection device 10 implemented according to the invention, in order to perform a modeling of this site, and to be able to implement a mapping of this site in 3 dimensions, in which topographic data and radiological data are jointly represented, and without necessarily having a prior knowledge of the topography of the site.

In this example, the detection device 10 can be integrated into a portable terminal 1 by the intervening operator I, which is displaced in the contaminated site. To enable these measurements to be obtained in 3 dimensions, besides conventional displacements on a same plane (the plane [O,x,y] of the orthogonal reference frame [O,x,y,z] given in FIG. 1), the detection device 10 is moved at different heights (defined according the axis z of the orthogonal reference frame [O,x,y,z]) with respect to the ground of the contaminated site.

The mapping is incrementally created as the intervening operator I moves, according to a SLAM (Simultaneous Localization And Mapping) type technique.

Figure 2:
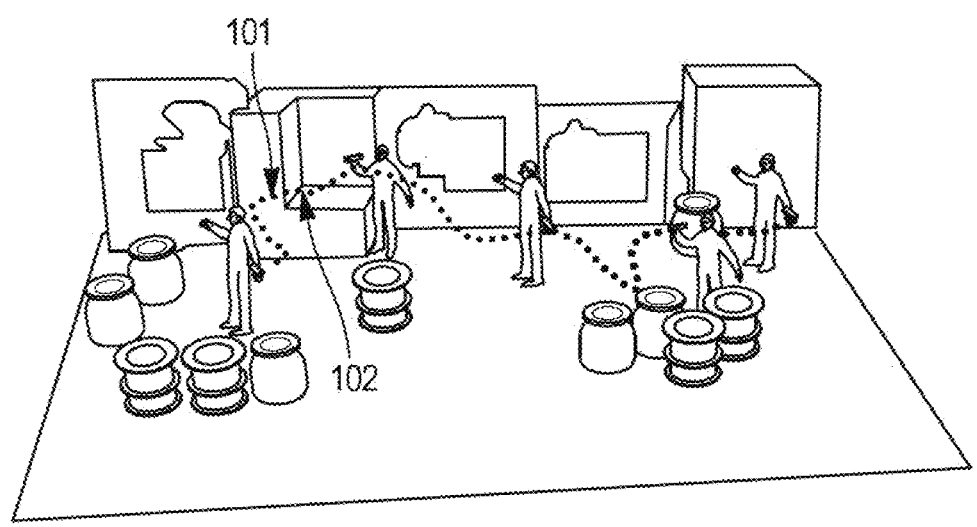
Figure 3:
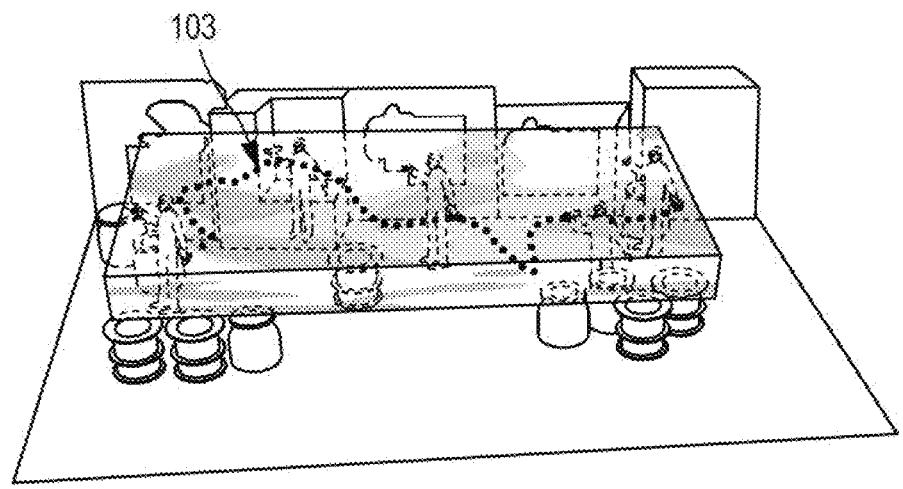

With such a detection device 10, acquiring information 101 related to the topography of the site and odometry data 102 (FIG. 2) is performed simultaneously to acquiring data of radiological measurements 103 (FIG. 3).

Among the information related to the topography of the site acquired during the displacement of the detection device 10, images of the constituent elements and/or objects of the site, data regarding the shape (volume, surface area, distance) and the appearance, for example the texture, of constituent elements and/or objects of the site, can be recorded.

Among the recorded odometry data there can also be data of distance or depth between the detection device 10 and/or the constituent elements and/or objects of the site, position and/or orientation data of the detection device 10, displacement speed data of the detection device 10 and/or displacement speed variation data.

These odometry data especially enable a path T of the detection device 10 to be assessed with respect to a displacement starting point, from which location coordinates in the site of the detection device 10 are deduced.

Another estimation of the path can also be performed using said images taken by the detection device 10, by using visual landmarks acting as references and which one tries to find on each image to deduce a path therefrom.

These different path estimations can then be compared and combined in order to produce a new path estimation.

Simultaneously to the acquisition of topographic data and data enabling a path of the detection device 10 to be estimated, the radiological measurement data are taken using one or more sensors integrated into the detection device 10. These radiological measurements can comprise measurements of counting rates as a function of the energy and dose rate, for example using an integrated radiation meter, as well as measurements by gamma spectrometry.

Figure 4:
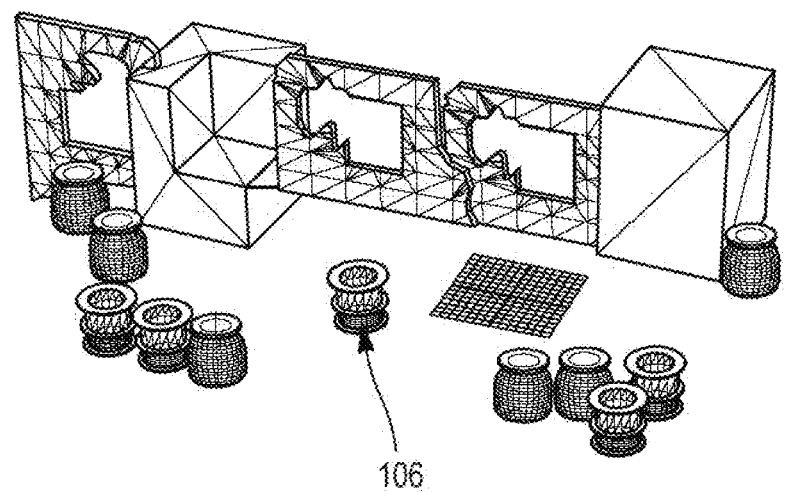
Figure 5:
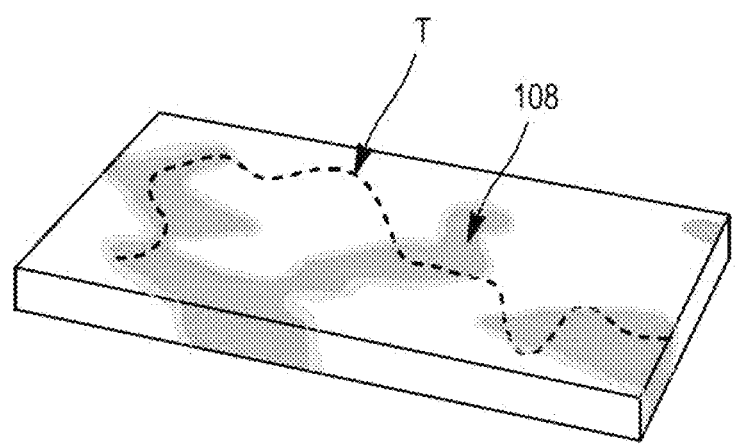

FIG. 4 illustrates a 3D modeling of the topography of elements 106 of the contaminated site detected along the path followed by the detection device 10 and implemented using a computer processing system, whereas FIG. 5 illustrates a modeling of a radiological distribution 108 along said path followed by the detection device 10.

Figure 6A:
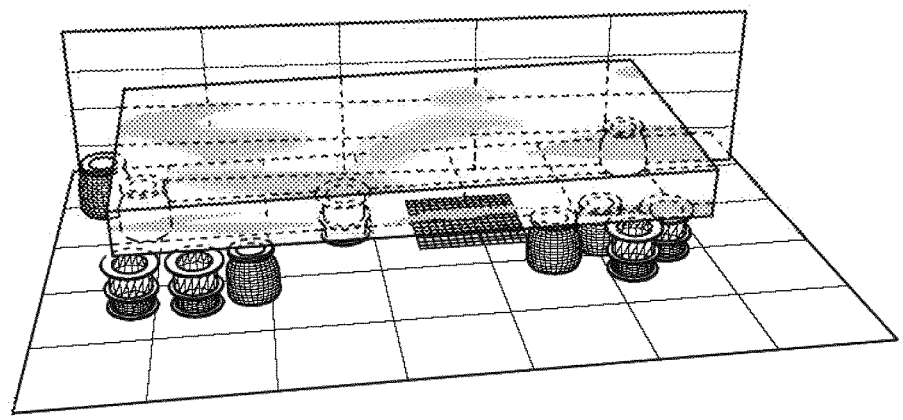
FIGS. 6A-6B illustrate a superimposed modeling of the topographic data and of the radiological data of the contaminated site.
Figure 6B:
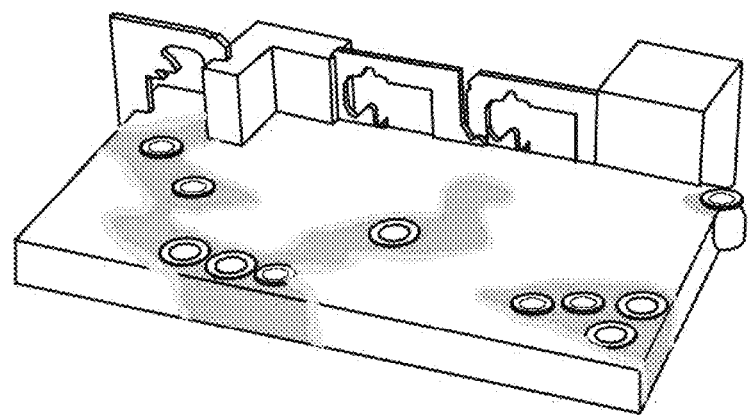

These modelings are superimposed in a same 3D mapping (FIGS. 6A and 6B), which can be incrementally built.

In order to create this mapping, a prediction method for example of the type described in EP 1 170 681 wherein an interpolation of radiological data is performed, can be implemented.

A Kriging-type linear estimation method for example such as the one described in EP 0 960344 can also be used to perform the interpolation of radiological data in the volume delimited by the path, or even an Inverse Distance Weighting (IDW) method.

The 3D mapping can be built in real time and can thus be available and displayed on a screen of the terminal 1 of the intervening operator I, as it is created.

Superimposing models can be performed via the computer processing system which combines the data taken by the detection device 10 into a matrix and incrementally produces a 3D mapping in which topographic data and radiological data are compiled.

According to an example, a vector of measurements performed at a time t and from which the matrix $P_t$ is created, can have the following form: $P_t=f(M(x,y,z), C(E), D, I(M))_t$, M being the position of the detector with respect to a reference frame [O,x,y,z], C(E) being a number of counts measured as a function of the energy, D a dose measurement, I an image taken at the position M.

This computer processing system can be integrated into said terminal or alternatively be adapted for a remote communication with the detection device 10 integrated into the terminal 1.

A step of identifying a source or sources of radioactive substance(s) in said environment can also be performed using this computer processing system, the identified source(s) can be later represented on a mapping which can be available for the operator on a screen of his/her terminal.

Figure 7:
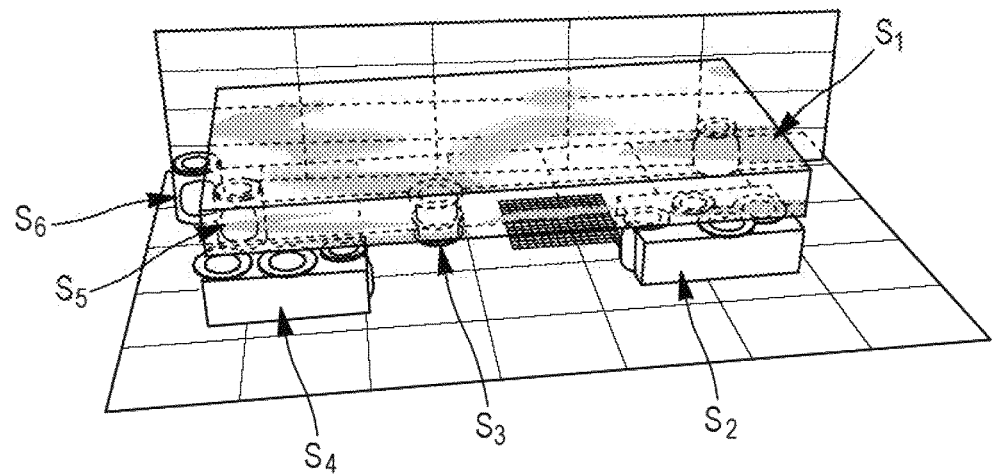
FIG. 7 illustrates a mapping in which sources at the origin of ionizing radiations have been localized.

FIG. 7 illustrates such a 3D mapping on which radioactive sources $S_1, S_2, S_3, S_4, S_5, S_6$ have been located.

Determining source terms, that is terms which describe a set of data of the sources $S_1, S_2, S_3, S_4, S_5, S_6$ identified as being at the origin of the ionizing radiations is also performed.

Figure 8:
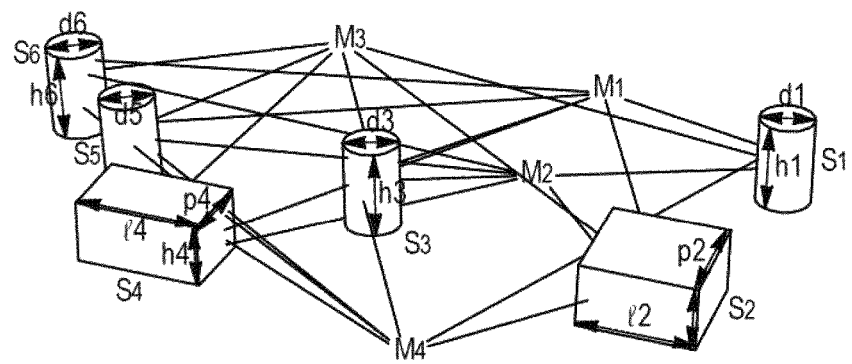
FIG. 8 illustrates a modeling of source terms.

The source terms comprise data related to the geometry of sources and especially to their dimensions such as the diameter dx, the height hx, the depth px, the length Lx, the width Ix, as well as distance data of the sources with respect to each other and at measurement points M1, M2, M3, M4, M5, M6 through which the detection device 10 has passed (FIG. 8).

These data can be obtained by computation using pattern recognition algorithms.

The source terms can also comprise hypotheses related to the physicochemical composition, the medium or material type into which the sources are integrated, the bulk density of this medium or material.

Determining the source terms is also completed by an estimation of the activity and of the radionuclide composition of each source $S_1, S_2, S_3, S_4, S_5, S_6$ at the origin of the irradiation.

Estimating the activity of the irradiation sources present in the radiological scene can be performed using probabilistic estimation methods for example of the Monte-Carlo type, or deterministic for example of the kernel integration type, by using the radiological data collected by the detection device 10.

Estimating the activity of the irradiation sources present in the radiological scene can also comprise a step of optimization.

This optimization can be a linear optimization with or without constraints, the number of sources and of measurement points being correlated. Such a linear optimization type comprises for example the use of a simplex-type algorithm.

As an alternative, a non-linear optimization with or without constraints, with the number of sources and of measurement points not being correlated, can be implemented. This other type of non-linear optimization can be performed using Generalized Reduced Gradient (GRG)-type iterative methods.

Figure 9:
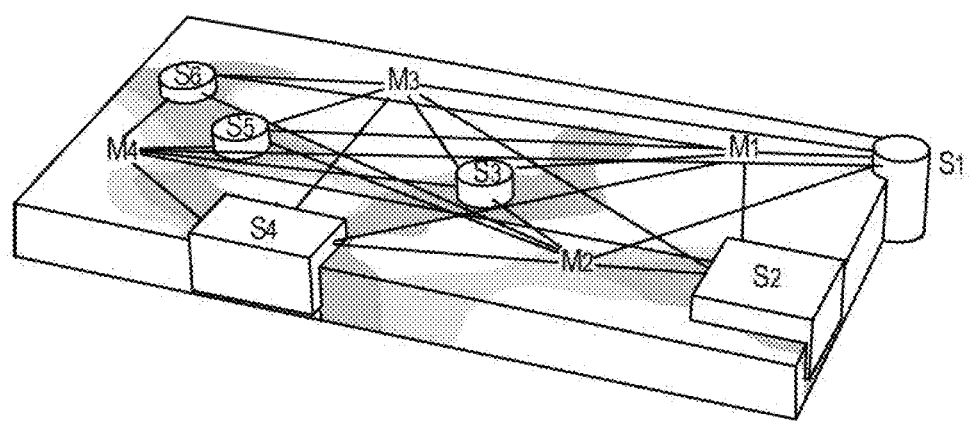
FIG. 9 illustrates a modeling in which identified sources and their associated activity are jointly represented.

A new modeling in which all the identified sources $S_1, S_2, S_3, S_4, S_5, S_6$ and their associated source terms are integrated can then be implemented (FIG. 9). A new 3D mapping of the recomputed emergent flux at any point of the space can thus be created and in which estimated radiological data, and in particular activity or radiological contamination data of the different sources are represented.

Collecting measurements such as illustrated in FIG. 1, can alternatively be performed by a drone or a robot, which is remotely controlled or autonomously displacing using odometry data and images taken by the detection device 10. In this case, the drone or robot is adapted to move at different altitudes or heights, in order to implement a 3-dimensional mapping.

Figure 10:
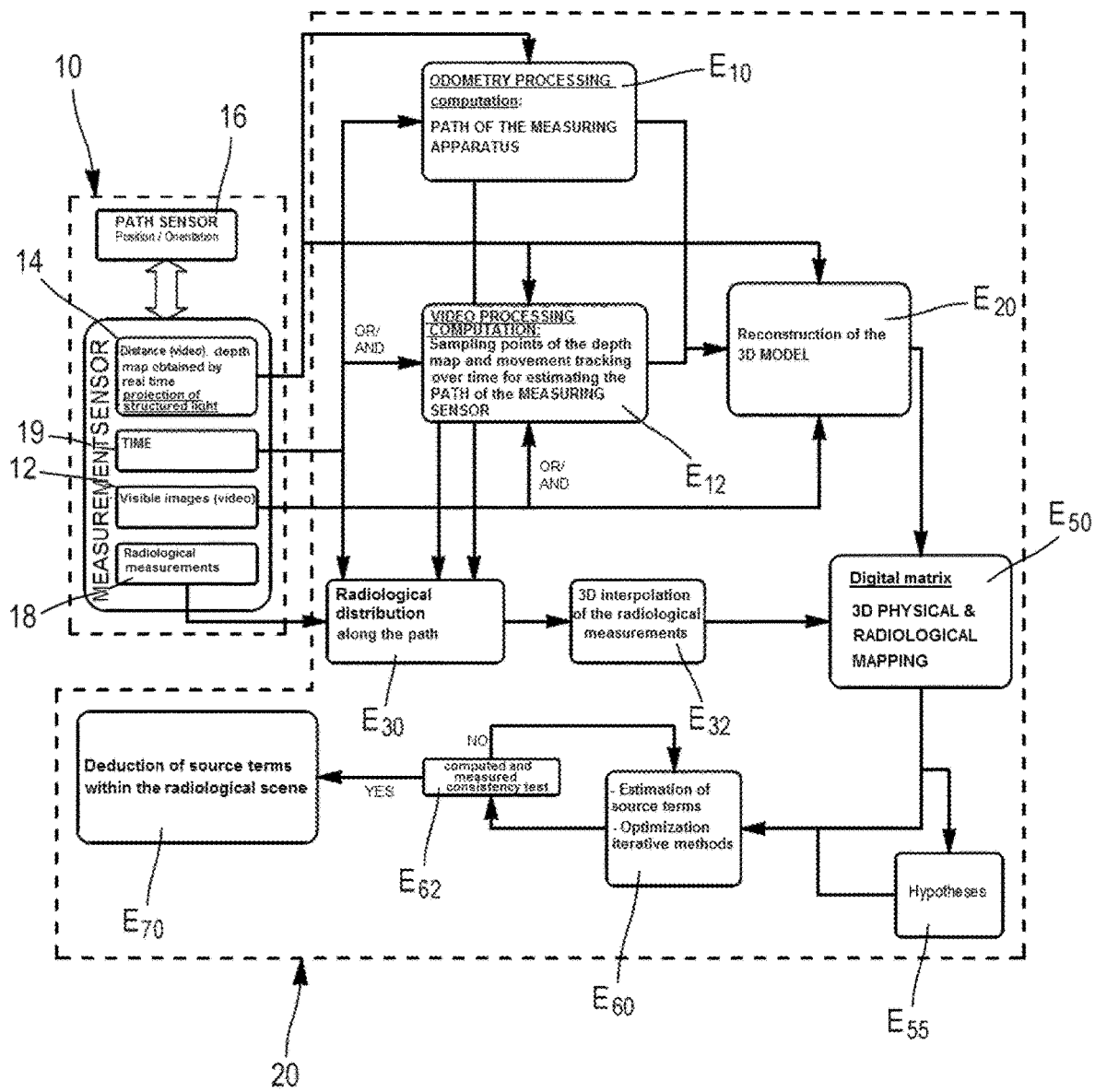
FIG. 10 illustrates an exemplary operating flowchart of a modeling device according to the invention.

FIG. 10 illustrates an operation of an exemplary device for modeling an environment with a risk of nuclear contamination.

This device first includes a detecting device 10, such as previously mentioned, including means for acquiring topographic data and odometry data.

The detection device includes a system 12 for acquiring images, which can comprise one or more cameras for example stereo cameras and/or an integrated three-dimensional scanner in order to also enable the collection of information regarding the form (volume, surface area) and possibly the appearance, for example the texture of constituent elements or objects of an environment. The scanner can be for example an active contactless scanner emitting a radiation, for example a laser radiation, in the environment and detecting a reflected radiation. The detection device 10 can alternatively integrate an imaging system such as the one described in US 2006/0221072 A1.

The imaging system can also be associated with or coupled to a distance measuring module 14, in order to create a depth map which will be combined to the images acquired by the imaging system 12. The distance measuring sensor can for example be an infrared telemetric device projecting structured light on the constituent objects or elements of the studied environment, or an ultrasound telemeter.

The device further comprises a module for acquiring 16 odometry data comprising one or more motion sensor(s), and/or inertial sensor(s), for example an accelerometer and/or a gyrometer, or a set of accelerometers and pyrometers forming an inertial unit.

This acquisition module 16 can also be coupled to the imaging system 12 and especially enables information related to the environment to be recorded, but also data related to the path followed by the detection device 10, these path data being useful for building the mapping of an environment and for locating the detecting device 10 in this environment, for example by constituting 3D coordinates.

The detection device 10 further comprises a module 18 for acquiring radiological data such as measurement data of the counting rate, dose rate, gamma spectrometry data.

A time base 19 is used to enable a time resetting of the different data, images, measurements, acquired by the detection device to be performed.

To implement the modeling from the data collected by the detection device 10, the modeling device according to the invention further comprises a computer processing system 20 an exemplary operating flowchart of which is illustrated in FIG. 10.

A processing step (step $E_{10}$) performed by the system 20, consists in using data supplied by the module for acquiring 16 odometry data and by the distance sensing module 14 to perform a path estimation of the detection device 10.

Another estimation (step $E_{12}$) of the path of the detection device 10 using the images supplied by the imaging system 12 and possibly odometry data coming from the modules 14 and 16 can be performed in parallel.

These estimations can be compared in order to perform a new path estimation.

The processing system is also provided to perform a reconstruction of a 3D model (step $E_{20}$) of the environment, in which the detection device 10 is displaced, from images and odometry data.

Simultaneously to this reconstruction, the processing system is configured to perform a modeling of the radiological distribution of the environment along said path followed by the detection device 10 (step $E_{30}$).

The processing system is further configured to implement an interpolation (step $E_{32}$) of the radiological measurements.

The result of this interpolation and the 3D model obtained at the end of the reconstruction step $E_{20}$ enable the system 20 to constitute (step $E_{50}$) a matrix in which topographic data of the studied environment and said radiological data associated with location data are compiled.

In the same time, a 3D mapping representing said environment in which said topographic data and said radiological data are simultaneously represented is created.

A step of estimating (step $E_{60}$) source terms concerning the geometry of the ionizing radiation sources, their composition, the type of emitted radionuclide, the activity of the sources is then implemented. This estimation is performed using hypotheses deduced (step $E_{55}$) from the data acquired by measurements possibly combined with data inputted by a user of the modeling device.

An optimization method with or without a constraint can also be performed to improve the estimation.

A comparison (step $E_{62}$) can be performed to check a consistency between radiological data, for example the dose rates, which have been computed and measured radiological data, in order to refine this estimation.

A step (step E70) consisting in producing a new modeling in which the sources and their associated source terms are integrated is then implemented. This new modeling can be represented as a new 3D mapping of the recomputed emergent flux at any point of the space, in which the sources and their activity are jointly represented.

The abovementioned computer processing system 20 includes at least a programmable processor, a memory module and an input peripheral, coupled to a system bus.

The processor can be for example a microprocessor, an FPGA or a central unit processor. The memory module can for example comprise a read only memory ROM, a program storage EPROM, a dynamic random access memory DRAM or any other type of RAM memory, a magnetic or optical storage element, registers or other volatile and/or non-volatile memories.

Algorithms under the form of instructions can be stored in the program memory, and enable a modeling such as abovedescribed to be performed, in order to produce a 3D mapping.

A program, enabling the modeling method to be implemented can be resident or recorded on a medium (for example an SDRAM memory card or a DVD-ROM or Blue-ray disk or a removable hard disk or a magnetic recording medium or a USB flash drive) likely to be read by the computer system.

The computer processing system 20 can also be connected to a peripheral such as for example a screen enabling the 3D mapping to be displayed, on which topographic data of an environment and radiological data, in particular of nuclear contamination of this environment, are simultaneously represented. The computer processing system 20 can be integrated into the terminal.

The computer system can be connected to a network, possibly through a wireless communication.

The invention claimed is:

1. A method for modeling an environment with a risk of nuclear contamination comprising steps of:
    a) acquiring, using a terminal comprising a detector and through a 3-dimensional displacement of the terminal in said environment, measurements related to the topography of said environment, radiological measurement data of said environment, position measurement of the detector, displacement measurement of the detector, distance measurement between the detector and one or more elements of said environment and then via a computer processing unit integrated in said terminal:
    b) estimating path data with respect to a displacement starting point, said path data being inferred from said position measurements, displacement and distance measurements,
    c) associating said radiological measurement data with location data in said environment, said location data having been deduced by said computer processing unit from path data of said detector, d) creating, using said information and via said computer processing unit: at least one matrix in which topographic data of said environment and radiological data associated with the location data are compiled, and a 3-dimensional mapping representing said environment in which said topographic data and said radiological data are jointly represented, the mapping being developed in real time and being displayed on a screen of the terminal as it is developed.

2. The modeling method according to claim 1, further comprising steps of:

identifying, via said computer processing unit and from said matrix, one or more sources of radioactive substance(s) in said environment, locating, via said computer processing unit, said sources of radioactive substance(s) on said mapping created in step c).

3. The modeling method according to claim 2, further comprising a step of determining one or more set(s) of data referred to as source terms characterizing at least one identified source of radioactive substance(s), determining the source terms comprising estimating an activity level of said identified source of radioactive substance(s).

4. The modeling method according to claim 2, further comprising a step of creating another 3D mapping of recomputed emergent flux in which identified sources of radioactive substance(s) and their estimated activity are jointly represented.

5. The modeling method according to claim 1, wherein acquiring information related to the topography of said environment comprises acquiring by said detector one or more image(s) of said environment, said path data being estimated at least from said image(s) of said environment.

6. The modeling method according to claim 1, further comprising the creation of a depth map from distance measurements between the detector and one or more element(s) of said environment.

7. A non-transitory computer-readable medium usable by a computer processing unit integrated in a terminal comprising a detector, the non-transitory computer-readable medium comprising code instructions of a computer program that when executed by the computer processing unit cause the computer processing unit to execute a method comprising the steps of:

a) acquiring, using the terminal comprising the detector and through a 3-dimensional displacement of the terminal in said environment, measurements related to the topography of said environment, radiological measurement data of said environment, position measurement of the detector, displacement measurement of the detector, distance measurement between the detector and one or more elements of said environment, b) estimating path data with respect to a displacement starting point, said path data being inferred from said position measurements, displacement and distance measurements, c) associating said radiological measurement data with location data in said environment, said location data having been deduced by said computer processing unit from path data of said detector, d) creating, using said information and via said computer processing unit: at least one matrix in which topographic data of said environment and radiological data associated with the location data are compiled, and a 3-dimensional mapping representing said environment in which said topographic data and said radiological data are jointly represented, the mapping being developed in real time and being displayed on a screen of the terminal as it is developed.

8. A device for modeling an environment with a risk or risks of nuclear contamination comprising:

a terminal provided with a detector, the detector comprising a first acquiring unit for acquiring information related to the topography of said environment, and second acquiring unit configured to acquire radiological measurements of said environment, and third acquiring unit configured to acquire position measurements, displacement measurements and distance measurements, a computer processing unit integrated in said terminal and connected to a screen of the terminal, the computer processing unit being configured to:

estimate path data with respect to a displacement starting point, said path data being inferred from said position measurements, displacement and distance measurements, associate said radiological measurements with location data in said environment, said location data having been deduced from said path data of said detector, incrementally create at least one matrix in which topographic data of said environment and radiological data associated with the location data are combined, and a 3D mapping representing said environment in which said topographic data and said radiological data are jointly represented, the 3D mapping being developed in real time and being displayed on the terminal screen as it is developed.

9. The device according to claim 8, wherein the processing unit is further configured to:

identify, from said matrix, one or more set(s) of data describing at least one source of radioactive substance(s) in said environment, locate said source of radioactive substance(s) on said created 3D mapping.

10. The modeling device according to claim 9, the computer processing unit further being configured to estimate an activity level of said identified source of radioactive substance(s).

11. The modeling device according to claim 10, wherein the computer processing unit is further configured to: create another 3D mapping of the recomputed emergent flux in which identified sources of radioactive substance(s) and their estimated activity are jointly represented.

12. The modeling device according to claim 9, the processing unit further being configured to estimate the path of the detector:

at least from image(s) of said environment and/or at least from position and/or displacement measurements of the detector and at least from distance measurements between the detector and one or more element(s) of said environment.

* * * * *

UNITED STATES PATENT AND TRADEMARK OFFICE
CERTIFICATE OF CORRECTION

| | |
|---|---|
| PATENT NO. | : 10,733,330 B2 |
| APPLICATION NO. | : 14/912480 |
| DATED | : August 4, 2020 |
| INVENTOR(S) | : Philippe Dubart et al. |

It is certified that error appears in the above-identified patent and that said Letters Patent is hereby corrected as shown below:

In the Specification

Column 7, Line 18, "accelerometers and pyrometers" should read -- accelerometers and gyrometers --

Signed and Sealed this
Fourth Day of April, 2023

Katherine Kelly Vidal
*Director of the United States Patent and Trademark Office*